United States Patent
Wakabayashi

(10) Patent No.: US 9,437,559 B2
(45) Date of Patent: Sep. 6, 2016

(54) HIGH-FREQUENCY MODULE

(71) Applicant: Murata Manufacturing Co., Ltd., Nagaokakyo-shi, Kyoto-fu (JP)

(72) Inventor: Yuki Wakabayashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/686,922

(22) Filed: Apr. 15, 2015

(65) Prior Publication Data

US 2015/0221600 A1 Aug. 6, 2015

Related U.S. Application Data

(63) Continuation of application No. PCT/JP2013/080189, filed on Nov. 8, 2013.

(30) Foreign Application Priority Data

Dec. 7, 2012 (JP) ................................ 2012-267909

(51) Int. Cl.
H01L 23/58 (2006.01)
H01L 23/66 (2006.01)
(Continued)

(52) U.S. Cl.
CPC ........... *H01L 23/66* (2013.01); *H01L 23/5384* (2013.01); *H01L 25/165* (2013.01); *H04B 5/0056* (2013.01); *H05K 1/0218* (2013.01); *H05K 1/0243* (2013.01); *H05K 1/11* (2013.01); *H05K 1/181* (2013.01);
(Continued)

(58) Field of Classification Search
CPC ........... H01L 23/66; H01L 2223/6677; H01L 23/49822; H01L 23/50; H01L 23/5384; H01L 2223/6616; H01L 2223/6655; H01L 2223/49838; H01L 23/49838
See application file for complete search history.

(56) References Cited

U.S. PATENT DOCUMENTS

| | | | | |
|---|---|---|---|---|
| 7,781,065 B2* | 8/2010 | Nakao | ................ | H01L 21/4807 428/426 |
| 2002/0061629 A1* | 5/2002 | Nishide | ............... | H01L 21/4867 438/453 |
| 2004/0000425 A1* | 1/2004 | White | ................. | H01L 21/4857 174/250 |
| 2006/0283547 A1* | 12/2006 | Yuri | .................... | H01L 21/4857 156/308.6 |

(Continued)

FOREIGN PATENT DOCUMENTS

| | | |
|---|---|---|
| JP | 03-106097 A | 5/1991 |
| JP | 06-052191 U | 7/1994 |

(Continued)

OTHER PUBLICATIONS

Official Communication issued in International Patent Application No. PCT/JP2013/080189, mailed on Dec. 10, 2013.

*Primary Examiner* — Khiem D Nguyen
(74) *Attorney, Agent, or Firm* — Keating & Bennett, LLP

(57) ABSTRACT

A high-frequency module includes a laminate, a bottom surface electrode, and internal electrodes that provide grounding. The bottom surface electrode is provided on a bottom surface of the laminate. The laminate includes a wiring region through which wiring of a high-frequency circuit passes. The internal electrodes that provide grounding are provided between layers of the laminate and connected to the bottom surface electrode, respectively. The internal electrodes that provide grounding each include a line including ends extending outside of the wiring region along an outer edge of the laminate. The internal electrodes that provide grounding are endlessly continuous with each other when seen in a lamination direction of the laminate.

17 Claims, 6 Drawing Sheets

(51) Int. Cl.
*H05K 1/02* (2006.01)
*H01L 23/538* (2006.01)
*H01L 25/16* (2006.01)
*H04B 5/00* (2006.01)
*H05K 1/11* (2006.01)
*H05K 1/18* (2006.01)
*H01L 23/498* (2006.01)

(52) U.S. Cl.
CPC *H01L 23/49822* (2013.01); *H01L 2223/6616* (2013.01); *H01L 2223/6655* (2013.01); *H01L 2223/6677* (2013.01); *H01L 2224/16225* (2013.01); *H01L 2924/1421* (2013.01); *H01L 2924/15313* (2013.01); *H01L 2924/19105* (2013.01); *H01L 2924/3025* (2013.01); *H05K 1/0298* (2013.01); *H05K 2201/09354* (2013.01); *H05K 2201/09618* (2013.01)

(56) References Cited

U.S. PATENT DOCUMENTS

| 2007/0215962 | A1* | 9/2007 | Minervini | B81B 7/0064 257/414 |
| 2012/0075002 | A1* | 3/2012 | Uejima | H04B 1/006 327/365 |
| 2012/0306609 | A1* | 12/2012 | Kato | H01F 17/0013 336/200 |

FOREIGN PATENT DOCUMENTS

| JP | 07-240595 A | 9/1995 |
| JP | 2000-040895 A | 2/2000 |

\* cited by examiner

HIGH-FREQUENCY MODULE

BACKGROUND OF THE INVENTION

1. Field of the Invention

The present invention relates to a high-frequency module including internal electrodes and via electrodes connected to ground and a high-frequency circuit element provided inside a laminate substrate including a plurality of base materials laminated on each other.

2. Description of the Related Art

A high-frequency module is configured by mounting active elements, passive elements, or wiring configuring a high-frequency circuit inside a laminate substrate or on a top surface of the laminate substrate. The laminate substrate is configured by laminating a plurality of base materials, providing an internal electrode between layers, and providing via electrodes penetrating inside the layers (For example, see JP 06-52191 Y).

FIG. 6 is a perspective view of a laminate substrate which configures a high-frequency module according to a related art example.

A laminate substrate 101 illustrated in FIG. 6 includes a laminate 102 including a plurality of base materials, an internal electrode 103 for grounding provided between layers of the laminate 102, and via electrodes 104 for grounding provided inside the layers of the laminate 102. The internal electrode 103 is endlessly provided along an outer edge of the laminate 102 as viewed in a lamination direction (hereinafter, the outer edge as viewed in the lamination direction will be referred to simply as the "outer edge"). The via electrodes 104 are closely arrayed along the outer edge of the laminate 102 and connect together the internal electrodes 103 facing each other. Therefore, the laminate substrate 101 obtains a shield property against high-frequency noise at the outer edge of the laminate 102 by the internal electrodes 103 for grounding and the via electrodes 104 for grounding.

In the high-frequency module according to the related art example, since the internal electrodes 103 for grounding are provided along the outer edge of the laminate 102, the thickness on a periphery of the outer edge of the laminate 102 increases by the thicknesses of the internal electrodes 103. Additionally, since a thickness shrinkage of the laminate 102 generated during manufacturing becomes small around the via electrodes, the thickness on the periphery of the outer edge of the laminate 102 is greatly different from the thickness of a central portion thereof in a case where the number of the via electrodes 104 for grounding is large. Therefore, in order to mold the laminate 102 with high flatness, it is desirable that the number of the layers of the laminate 102, the number of the internal electrodes 103, and the number of the via electrodes 104 be smaller.

However, in the high-frequency module according to the related art example, since the internal electrodes 103 are provided along the entire periphery of the outer edge on all of the layers of the laminate 102, area other than the internal electrode 103 is small and area utilization efficiency is low. Therefore, in order to realize a complicated wiring structure where many active elements or passive elements are mounted in the laminate 102, it has been difficult to reduce the number of the layers of the laminate 102 and the number of the internal electrodes 103.

Moreover, the internal electrode 103 is provided in such a manner that the entire length thereof is almost the same as the entire length of the outer edge of the laminate 102. Accordingly, in a case where the number of the via electrodes 104 is reduced, the internal electrodes 103 become inductive and a potential difference from ground potential is generated in the internal electrodes 103, thereby deteriorating high-frequency properties. Therefore, in order to prevent deterioration of the high-frequency properties, it has been difficult to reduce the number of the via electrodes 104.

In this way, in the high-frequency module 101 according to the related art example, in order to secure the complicated wiring structure or the good high-frequency properties, the number of the layers of the laminate 102, the number of the internal electrodes 103, or the number of the via electrodes 104 cannot be reduced, and it has been difficult to realize high flatness.

Furthermore, in the laminate substrate 101 according to the related art example, since metallic density in the vicinity of the outer edge of the laminate 102 is high, permeation of gas (outgassing) emitted from internal residues during manufacturing is hindered, and delamination is easily generated between the layers of the laminate 102, thereby also causing a problem of lowering reliability.

SUMMARY OF THE INVENTION

Preferred embodiments of the present invention provide a high-frequency module capable of configuring a high-frequency circuit with a complicated wiring structure or a high-frequency circuit with good high-frequency properties and capable of realizing high flatness, reliability, and shield property, even when the number of internal electrodes that provide grounding or via electrodes that provide grounding is reduced.

A high-frequency module according to a preferred embodiment of the present invention includes a laminate, a plurality of bottom surface electrodes, a high-frequency circuit, and a plurality of internal electrodes that provide grounding. The laminate includes a plurality of base materials stacked on each other in a lamination direction. The bottom surface electrodes are provided on one principal surface of the laminate in the lamination direction. The high-frequency circuit is arranged to pass through an inside of the laminate and connected to at least any of the bottom surface electrodes. The internal electrodes that provide grounding are provided between layers of the laminate and connected to the bottom surface electrodes that provide grounding, respectively. The internal electrodes that provide grounding each include a line including ends extending outside of the high-frequency circuit along an outer edge of the laminate, and are endlessly continuous with each other when seen in the lamination direction.

In this configuration, since the plurality of internal electrodes that provide grounding is disposed so as to be endlessly continuous (loop shape) when seen in the lamination direction, the high-frequency circuit provided other than the internal electrodes that provide grounding is less likely affected by high-frequency noise. Moreover, since metallic density in the vicinity of the outer edge of the laminate is small, an outgassing property during manufacturing is high. Moreover, since overlapping of the internal electrodes that provide grounding in the lamination direction is relatively small, the thickness in the vicinity of the outer edge of the laminate is significantly reduced. Moreover, since the area occupied by the internal electrode that provide grounding on each layer is small, area utilization efficiency is high. Moreover, since each of the internal electrodes that provide grounding preferably has a shape of a line including ends and the length thereof is shorter than the length of an entire periphery of an outer edge portion, it is difficult for the internal electrodes that provide grounding to become inductive.

In the above-described high-frequency module, it is preferable that the high-frequency circuit include a surface mounting type element mounted on another principal surface opposite to the one principal surface of the laminate where the bottom surface electrodes are provided, and it is preferable that the bottom surface electrodes that provide grounding overlap with the high-frequency circuit when seen in the lamination direction.

In this configuration, while a shield property against a side surface direction is obtained by the internal electrodes that provide grounding, a shield property against the lamination direction can also be obtained by the surface mounting type element and the bottom surface electrodes that provide grounding.

In the above-described high-frequency module, it is preferable that end portions of the respective plurality of internal electrodes that provide grounding overlap with each other at corner portions of the laminate when seen in the lamination direction.

In this configuration, electrode density at the corner portions of the laminate becomes high and strength at the corner portions becomes high. Usually, since external stress acting on the high-frequency module from an external substrate is large at the corner portions of the laminate, reliability is further enhanced by increasing the strength at the corner portions.

In the above-described high-frequency module, the laminate may be a cube including first to fourth base materials, and the high-frequency module may include as the plurality of internal electrodes that provide grounding a first internal electrode provided on the first base material along a first side of the laminate when seen in the lamination direction, a second internal electrode provided on the second base material along a second side perpendicular or substantially perpendicular to the first side, a third internal electrode provided on the third base material along a third side perpendicular or substantially perpendicular to the second side, and a fourth internal electrode provided on the fourth base material along a fourth side perpendicular or substantially perpendicular to the third side.

In the above-described high-frequency module, the first base material, the second base material, the third base material, and the fourth base material may be arrayed in the lamination direction in order according to the described order.

In the above-described high-frequency module, the laminate may be a cube including first and second base materials, and the high-frequency module may include as the plurality of internal electrodes that provide grounding a first internal electrode provided on the first base material along a first side of the laminate when seen in the lamination direction, a second internal electrode provided on the second base material along a second side perpendicular or substantially perpendicular to the first side, a third internal electrode provided on the first base material along a third side perpendicular or substantially perpendicular to the second side, and a fourth internal electrode provided on the second base material along a fourth side perpendicular or substantially perpendicular to the third side.

In the above-described high-frequency module, the laminate may be a cube including first and second base materials, and the high-frequency module may include as the plurality of internal electrodes that provide grounding a first internal electrode provided on the first base material along a first side of the laminate when seen in the lamination direction and a second side perpendicular or substantially perpendicular to the first side, and a second internal electrode provided on the second base material along a third side perpendicular or substantially perpendicular to the second side and a fourth side perpendicular or substantially perpendicular to the third side.

According to various preferred embodiments of the present invention, in the high-frequency module, the high-frequency circuit provided in the laminate is less likely to be affected by the high-frequency noise, and the high shield property is obtained. Moreover, since the outgassing property from the laminate is high during manufacturing, delamination is less likely to occur and high reliability is obtained. Moreover, since the thickness in the vicinity of the outer edge of the laminate is significantly reduced, high flatness is obtained.

Additionally, since the area utilization efficiency on each layer is high and also it is difficult for the internal electrodes that provide grounding to become inductive, it is easy to realize a complicated wiring structure or good high-frequency properties. Even in a case of realizing the complicated wiring structure or the good high-frequency properties, the number of the base materials, the number of the internal electrodes that provide grounding, and the number of the vias that provide grounding are reduced. Thus, extremely high flatness is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First, a high-frequency module according to a first preferred embodiment of the present invention will be described.

Figure 1:
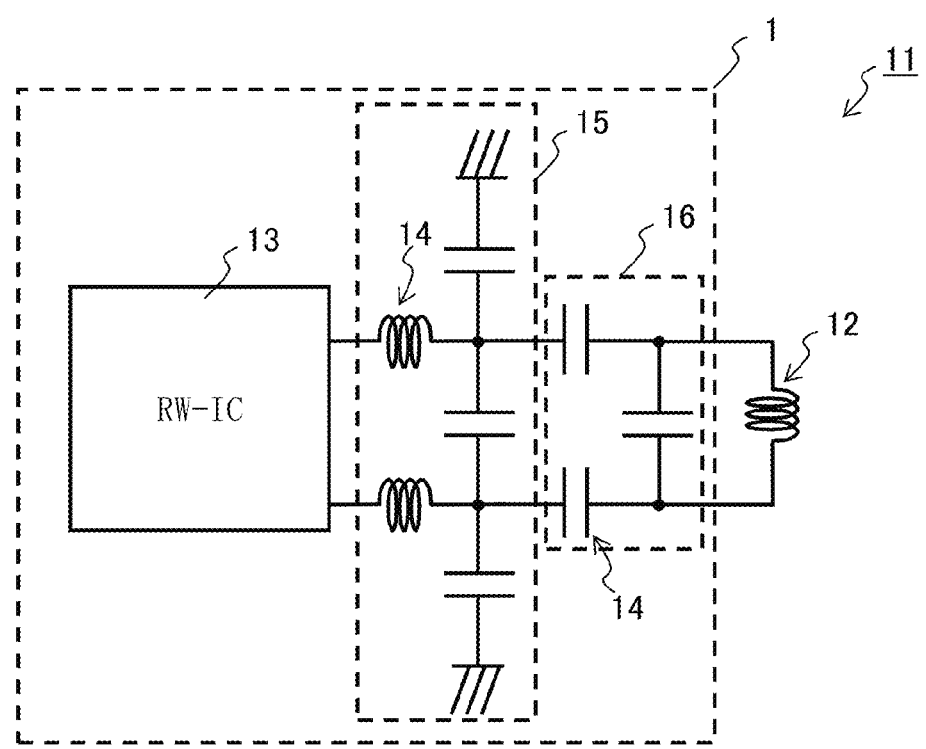
FIG. 1 is a circuit diagram of a high-frequency module according to a first preferred embodiment of the present invention.

FIG. 1 is a circuit diagram of a high-frequency circuit that a high-frequency module 1 according to the first preferred embodiment includes.

The high-frequency circuit 11 is, for example, a reader/writer circuit of an NFC (Near Field Communication) system and connected to an antenna 12.

The high-frequency circuit 11 includes an RF-IC 13 and a plurality of passive elements 14. The plurality of passive elements 14 configures a low pass filter circuit 15 and a matching circuit 16. The RF-IC 13 is connected to the antenna 12 via the low pass filter circuit 15 and the matching circuit 16. In the high-frequency circuit 11 such as the reader/writer circuit of the NFC system, high-frequency properties of each circuit element, i.e., a filter property in the low pass filter circuit 15 and a matching property by the matching circuit 16 are stabilized due to stabilization of ground potential.

Figure 2A:
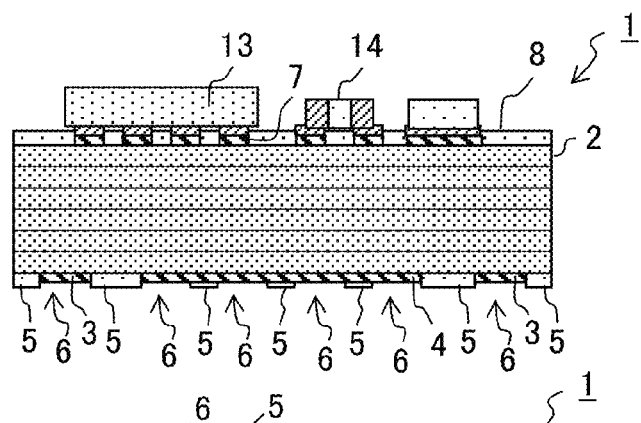
FIGS. 2A to 2C are diagrams explaining a structure of the high-frequency module according to the first preferred embodiment of the present invention.
Figure 2B:
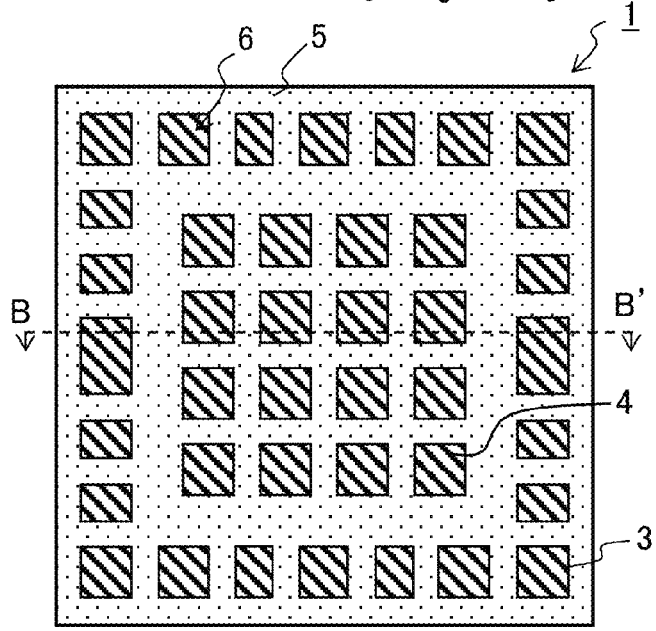

FIG. 2A is a cross-sectional view of a side surface side of the high-frequency module 1. FIG. 2B is a plan view of a bottom surface side of the high-frequency module 1. The cross section illustrated in FIG. 2A is a cross section at a position indicated by a broken line B-B' in FIG. 2B.

It is to be noted that in each drawing, a member having conductivity is illustrated by hatching of real straight lines and a member having an insulation property is illustrated by hatching of non-real straight lines.

In addition to the RF-IC 13 and the passive elements 14 configuring the above-described high-frequency circuit 11, the high-frequency module 1 includes a laminate 2, bottom surface electrodes 3 that provide input/output, a bottom surface electrode 4 that provides grounding, a bottom surface side resist 5, top surface electrodes 7, and a top surface side resist 8.

The laminate 2 is a cube with a bottom surface defining as a mounting surface and is configured preferably by laminating six layers of base materials, for example, which will be described below, in an up and down direction. In the high-frequency circuit 11 illustrated in FIG. 1, wiring connecting the RF-IC 13, the respective passive elements 14, and the antenna 12 is provided inside the laminate 2, as internal electrodes.

The RF-IC 13 and the respective passive elements 14 are preferably configured as chip type elements mounted on a top surface of the laminate 2. It is to be noted that, besides mounting on the top surface of the laminate 2 as chip type elements, a portion or all of the passive elements 14 may be incorporated in the laminate 2 as chip type elements or may be configured by the internal electrodes of the laminate 2.

The top surface electrodes 7 are provided on the top surface of the laminate 2 and terminals of the RF-IC 13 and the respective passive elements 14 are joined thereto. The top surface side resist 8 is provided on the top surface of the laminate 2 except regions where the top surface electrodes 7 are formed. The top surface side resist prevents the occurrence of a short circuit failure caused by leakage of solder provided to mount the RF-IC 13 or the respective passive elements 14 from the respective top surface electrodes 7.

The bottom surface electrodes 3 and the bottom surface electrode 4 are provided on a bottom surface of the laminate 2. Therefore, the high-frequency module 1 is configured to be of a bottom surface mounting type. The bottom surface electrodes 3 that provide input and output are pad electrodes with small area arrayed along an outer edge on the bottom surface of the laminate 2. These bottom surface electrodes 3 define and function as control terminals to which a control signal that controls the RF-IC 13 is input, output terminals outputting an output signal that the RF-IC 13 outputs, ground terminals, or the like. Moreover, the bottom surface electrode 4 is a pad electrode with large area provided on the bottom surface of the laminate 2 so as to cover a central portion surrounded by the bottom surface electrodes 3.

As illustrated in FIG. 2B, the bottom surface side resist 5 is provided on the bottom surface of the laminate 2 in a state in which a plurality of openings 6 is provided in a matrix shape. The bottom surface side resist 5 prevents the occurrence of a short circuit failure caused by leakage of the solder provided to mount the respective terminals during mounting on an external substrate 21, which will be described below.

The respective openings 6 expose the bottom surface electrodes 3 or the bottom surface electrode 4 on the bottom surface side of the laminate 2. More specifically, the plurality of openings 6 which is located in outer rows and columns arrayed along the outer edge of the laminate 2 each opposes whole surfaces of any of the plurality of bottom surface electrodes 3 and each exposes the whole surfaces of these bottom surface electrodes 3 on the bottom surface side of the laminate 2. Moreover, the plurality of openings 6 which is located in inner rows and columns arrayed in the vicinity of the central portion of the laminate 2 each opposes a portion of the bottom surface electrode 4 and each partially exposes the bottom surface electrode 4 on the bottom surface side of the laminate 2.

Figure 2C:
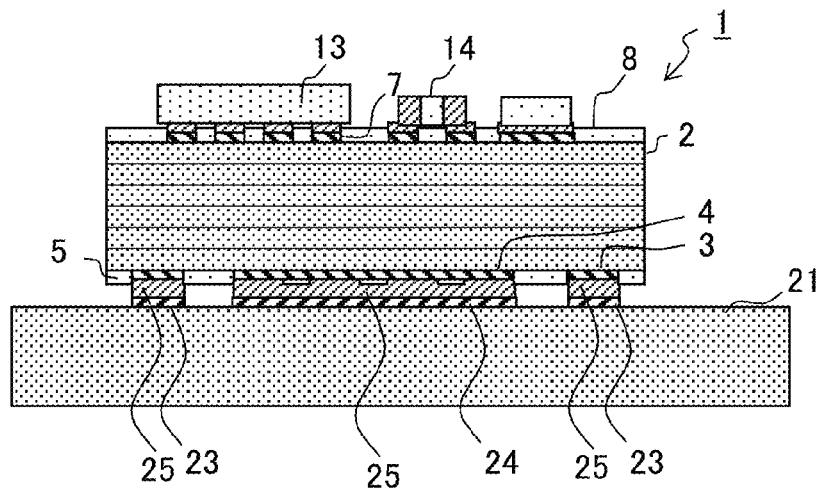

FIG. 2C is a cross-sectional view of the side surface side of the high-frequency module 1 in a state of being mounted on the external substrate.

As illustrated in FIG. 2C, the high-frequency module 1 is mounted on the external substrate 21. Component mounting electrodes 23, 24 are provided on a surface of the external substrate 21. The component mounting electrodes 23 are pad electrodes with a small area provided in respective regions overlapping with the plurality of pad electrodes configuring the bottom surface electrodes 3. The component mounting electrode 24 is a single pad electrode with a large area provided in a region overlapping with the pad electrode with large area configuring the above-described bottom surface electrode 4. Moreover, creamy solder for mounting (soldering paste) 25 is applied onto whole surfaces of the component mounting electrodes 23, 24, melted and solidified, and thus the component mounting electrodes are joined to the bottom surface electrodes 3 and the bottom surface electrode 4 exposed by the openings 6.

Figure 3A:
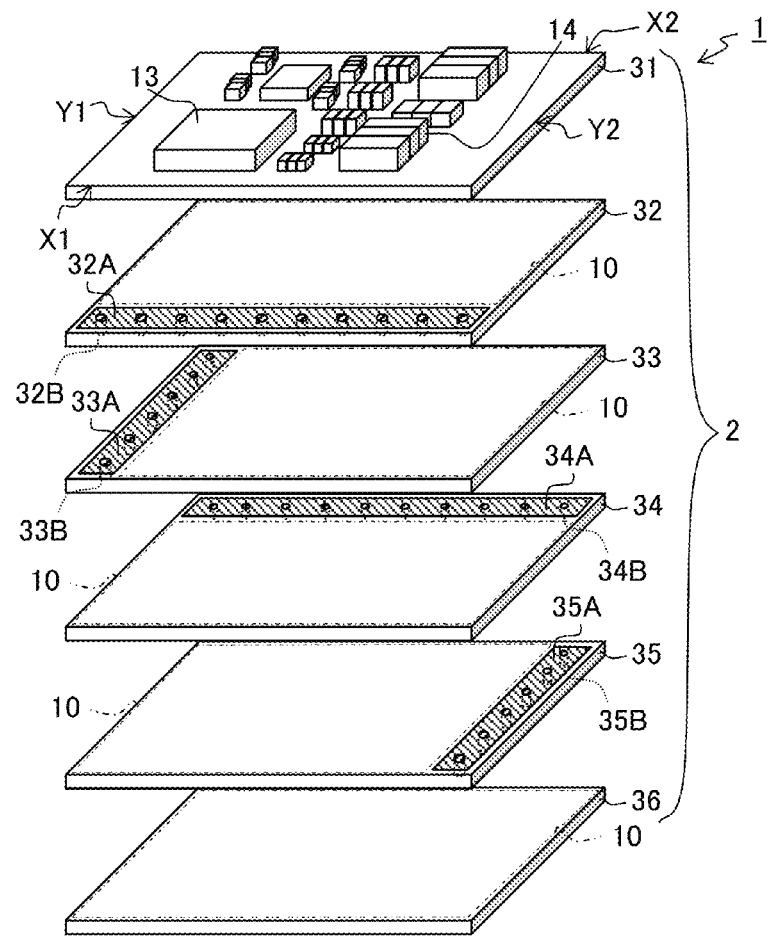
FIG. 3A is an exploded perspective view of the high-frequency module according to the first preferred embodiment of the present invention.
Figure 3B:
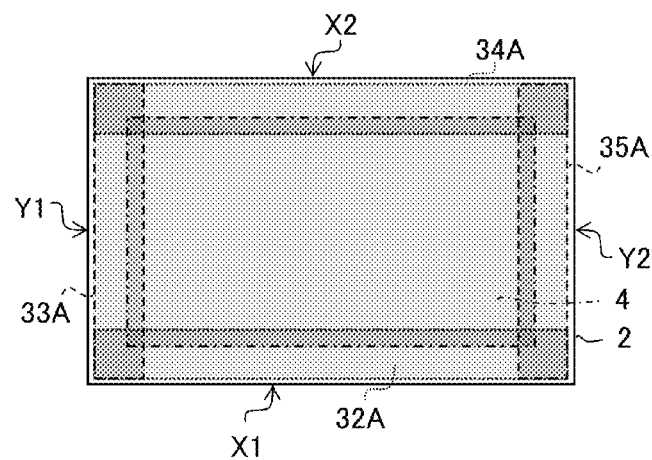
FIG. 3B is a transparent view thereof.

FIG. 3A is an exploded perspective view of the high-frequency module 1. FIG. 3B is a transparent view of the high-frequency module 1 as viewed from the top surface side in a lamination direction. It is to be noted that in the following description, a first side of the laminate 2 facing toward a lower side in FIG. 3B as viewed from the top surface side in the lamination direction is referred to as a "side X1." Moreover, a second side thereof facing toward a left side in FIG. 3B is referred to as a "side Y1." Moreover, a third side thereof facing toward an upper side in FIG. 3B is referred to as a "side X2." Moreover, a fourth side thereof facing toward a right side in FIG. 3B is referred to as a "side Y2."

A configuration of the laminate 2 will be described more specifically. As illustrated in FIG. 3A, the laminate 2 of the high-frequency module 1 preferably includes six layers of base materials 31, 32, 33, 34, 35, 36, for example. The base material 31 configures the top surface of the laminate 2, and the RF-IC 13 and the plurality of passive elements 14 described above are mounted on a top surface of the base material 31. The base material 36 configures the bottom surface of the laminate 2, and the bottom surface electrode 4 and the bottom surface electrodes described above are formed on a bottom surface of the base material 36. It is to be noted that in FIG. 3A, the bottom surface electrode 4 and the bottom surface electrodes 3 are not illustrated. The base materials 31, 32, 33, 34, 35, 36 are laminated in order according to the described order from the top surface side to the bottom surface side of the laminate 2.

The top surface electrodes 7 are provided on the top surface of the base material 31, and via electrodes connected to the top surface electrodes 7 are provided inside the base material 31. In FIG. 3A, the via electrodes and the top surface electrodes 7 of the base material 31 are not illustrated.

An internal electrode that provides 32A and vias that provide grounding 32B are provided at a portion in the vicinity of an outer edge of the base material 32. The internal electrode that provides grounding 32A extends along the side X1 as viewed from the top surface side in the lamination direction and preferably has a shape of a line including ends which are terminated in the vicinity of the sides Y1 and Y2, respectively. Moreover, the vias that provide grounding 32B are arrayed along the side X1 at equal or substantially equal intervals and connected to the internal electrode that provides grounding 32A by overlapping therewith.

Moreover, a region of the base material 32 where the internal electrode that provides grounding 32A is not provided as viewed in the lamination direction is configured as a wiring region 10. In the wiring region 10 of the base material 32, an internal electrode and via electrodes configuring connection wiring of the high-frequency circuit 11 illustrated in FIG. 1 are provided. In FIG. 3A, the wiring electrode and the via electrodes provided in the wiring region 10 of the base material 32 are not illustrated.

An internal electrode that provides grounding 33A and vias that provide grounding 33B are provided at a portion in the vicinity of an outer edge of the base material 33. The internal electrode that provides grounding 33A extends along the side Y1 as viewed from the top surface side in the lamination direction and preferably has a shape of a line including ends which are terminated in the vicinity of the sides X1 and X2, respectively. Moreover, the vias that provide grounding 33B are arrayed along the side Y1 at equal or substantially equal intervals and connected to the internal electrode that provides grounding 33A by overlapping therewith.

Moreover, a region of the base material 33 where the internal electrode that provides grounding 33A is not provided as viewed in the lamination direction is configured as a wiring region 10. In the wiring region 10 of the base material 33, an internal electrode and via electrodes configuring the connection wiring of the high-frequency circuit 11 illustrated in FIG. 1 are provided. It is to be noted that in the wiring region 10 of the base material 33, an internal electrode and via electrodes connected to the above-described vias that provide grounding 32B may be provided. In FIG. 3A, the wiring electrode and the via electrodes provided in the wiring region 10 of the base material 33 are not illustrated.

An internal electrode that provides grounding 34A and vias that provide grounding 34B are provided at a portion in the vicinity of an outer edge of the base material 34. The internal electrode that provides grounding 34A extends along the side X2 as viewed from the top surface side in the lamination direction and preferably has a shape of a line including ends which are terminated in the vicinity of the sides Y1 and Y2, respectively. Moreover, the vias that provide grounding 34B are arrayed along the side X2 at equal or substantially equal intervals and connected to the internal electrode that provides grounding 34A by overlapping therewith.

Moreover, a region of the base material 34 where the internal electrode that provides grounding 34A is not provided as viewed in the lamination direction is configured as a wiring region 10. In the wiring region 10 of the base material 34, an internal electrode and via electrodes configuring the connection wiring of the high-frequency circuit 11 illustrated in FIG. 1 are provided. It is to be noted that in the wiring region 10 of the base material 34, an internal electrode and via electrodes connected to the above-described vias that provide grounding 32B, 33B may be provided. In FIG. 3A, the wiring electrode and the via electrodes provided in the wiring region 10 of the base material 34 are not illustrated.

An internal electrode that provides grounding 35A and vias that provide grounding 35B are provided at a portion in the vicinity of an outer edge of the base material 35 as viewed in the lamination direction. The internal electrode that provides grounding 35A extends along the side Y2 as viewed from the top surface side in the lamination direction and preferably has a shape of a line including ends which are terminated in the vicinity of the sides X2 and X1, respectively. Moreover, the vias that provide grounding 35B are arrayed along the side Y2 at equal or substantially equal intervals and connected to the internal electrode that provides grounding 35A by overlapping therewith.

Moreover, a region of the base material 35 where the internal electrode that provides grounding 35A is not provided as viewed in the lamination direction is configured as a wiring region 10. In the wiring region 10 of the base material 35, an internal electrode and via electrodes configuring the connection wiring of the high-frequency circuit 11 illustrated in FIG. 1 are provided. It is to be noted that the in wiring region 10 of the base material 35, an internal electrode and via electrodes connected to the above-described vias that provide grounding 32B, 33B, 34B may be provided. In FIG. 3A, the wiring electrode and the via electrodes provided in the wiring region 10 of the base material 35 are not illustrated.

An entire region of the base material 36 as viewed in the lamination direction is configured as a wiring region 10. In the wiring region 10 of the base material 36, an internal electrode and via electrodes configuring the connection wiring of the high-frequency circuit 11 illustrated in FIG. 1 are provided. These internal electrode and via electrodes are also connected to the bottom surface electrodes 3 that provide input/output. Moreover, in the wiring region 10 of the base material 36, an internal electrode and via electrodes connected to the above-described vias that provide grounding 32B, 33B, 34B, 35B are provided. These internal electrode and via electrodes are also connected to the above-described bottom surface electrode 4. In FIG. 3A, the wiring electrode and the via electrodes provided in the wiring region 10 of the base material 36 are not illustrated.

Since the internal electrodes that provide grounding 32A to 35A are provided in the laminate 2 in this way, when viewed from the top surface side in the lamination direction as illustrated in FIG. 3B, the internal electrodes that provide grounding 32A to 35A provided at the respective base materials 32 to 35 are endlessly continuous inside the laminate 2.

Therefore, high-frequency noise coming from outside to this high-frequency module 1 or high-frequency noise generated inside the laminate 2 is absorbed or reflected by the internal electrodes that provide grounding 32A to 35A and the vias that provide grounding 32B to 35B over an entire periphery on a periphery of the outer edge of the laminate 2 where the internal electrodes that provide grounding 32A to 35A are provided. As a result, the high-frequency circuit 11 provided to pass through the wiring regions 10 of the respective base materials 31 to 36 has a high shield property on the side surface side of the laminate 2.

Moreover, as illustrated in FIG. 3B, when viewed from the top surface side in the lamination direction, the bottom surface electrode 4 that provides grounding located on the bottom surface of the laminate 2 covers an entire surface of a region surrounded by the internal electrodes that provide grounding 32A to 35A. Therefore, in this high-frequency module 1, not only the shield property against the side surface direction but also a shield property on the bottom surface side in the lamination direction is obtained. Moreover, since the top surface of the laminate 2 is mostly covered with the top surface electrodes 7 and the respective elements, this high-frequency module 1 secures a shield property on the top surface side in the lamination direction to a certain degree.

In this way, the shield property of the laminate 2 is greatly enhanced in the configuration of the high-frequency module 1 according to the present preferred embodiment. However, the thickness on the periphery of the outer edge of the laminate 2 increases more than the thickness in the vicinity of the center of the laminate 2, because the internal electrodes that provide grounding 32A to 35A and the vias that provide grounding 32B to 35B are provided.

However, on the periphery of the outer edge of the laminate 2, the internal electrodes that provide grounding 32A to 35A overlap with each other only at corner portions, and the thickness of the laminate 2 increases by the thickness of the internal electrodes that provide grounding 32A to 35A. At the other portions, the internal electrodes that provide grounding 32A to 35A do not overlap with each other, and the thickness of the laminate 2 increases only by the thickness of one of the internal electrodes that provide grounding 32A to 35A.

Therefore, metallic density becomes small in at least a portion of the region in the vicinity of the outer edge in the laminate 2. Then, in a case where a solvent component or moisture included in a material during formation of the laminate 2 volatilizes, volatilized gas easily escapes from the laminate 2. Therefore, the occurrence of malfunctions such as delamination between the layers caused by stagnation of the volatilized gas inside the laminate 2 is significantly reduced or prevented. Moreover, the metallic density becomes large and strength becomes locally high at the corner portions of the laminate 2. Then, even in a case where external stress acting on the corner portions of the laminate 2 is large, the laminate 2 is difficult to break. Therefore, the damage and breaking of the laminate 2 by the external stress or the occurrence of delamination by the residual gas are significantly reduced or prevented, and reliability of the high-frequency module becomes high.

Moreover, in each of the base materials 32 to 35, since an area occupied by each of the internal electrodes that provide grounding 32A to 35A is only an area of the region along one side of the outer edge portion, an area occupied by each of the wiring regions 10 is large, and area utilization efficiency in each of the base materials 32 to 35 becomes high. Therefore, even when the wiring structure of the high-frequency circuit 11 is complicated, it is not necessary to increase the number of the base materials in the laminate 2, and the number of the internal electrodes that provide grounding is reduced. Then, since an increase in the thickness of the laminate 2 by the internal electrodes that provide grounding is prevented, even when the wiring structure of the high-frequency circuit 11 is complicated, high flatness of the laminate 2 is achieved.

Moreover, the internal electrodes that provide grounding 32A to 35A are sufficiently short compared with the length of the entire periphery of the outer edge of the laminate 2. Even when the number of the vias that provide grounding 32B to 35B is small, it is difficult for the internal electrodes that provide grounding to become inductive. Therefore, it is difficult for the internal electrodes that provide grounding 32A to 35A to have a potential difference from the ground potential and it is easy to realize good high-frequency properties. For this reason, the number of the vias that provide grounding is reduced while the good high-frequency properties are realized. Then, during manufacturing, an influence of a reduction in a thickness shrinkage of the laminate 2 generated on the periphery of the vias that provide grounding is prevented, and flatness of the laminate 2 is further enhanced.

The above description has given the example in which the internal electrodes that provide grounding 32A to 35A are preferably arranged so as to be spirally displaced. However, the arrangement of the internal electrodes that provide grounding 32A to 35A is not limited to the above-described arrangement. For example, a lamination order of the base materials where the internal electrodes that provide grounding 32A to 35A are provided may be changed.

Moreover, there has been given here the example in which the bottom surface electrodes 3 that provide input/output are arranged on the periphery of the outer edge and the bottom surface electrode 4 that provides grounding is arranged in the vicinity of the center on the inner side. However, the arrangement of the bottom surface electrodes is not limited to such an arrangement relationship.

Moreover, there has been given here the example in which the internal electrodes that provide grounding 32A to 35A are preferably arranged so as to overlap with each other at the corner portions of the laminate 2. However, the internal electrodes that provide grounding 32A to 35A may overlap with each other at positions other than the corner portions of the laminate 2. For example, the internal electrodes that provide grounding may overlap with each other in the vicinity of the centers of the respective sides of the outer edge.

Next, a high-frequency module according to a second preferred embodiment of the present invention will be described.

Figure 4A:
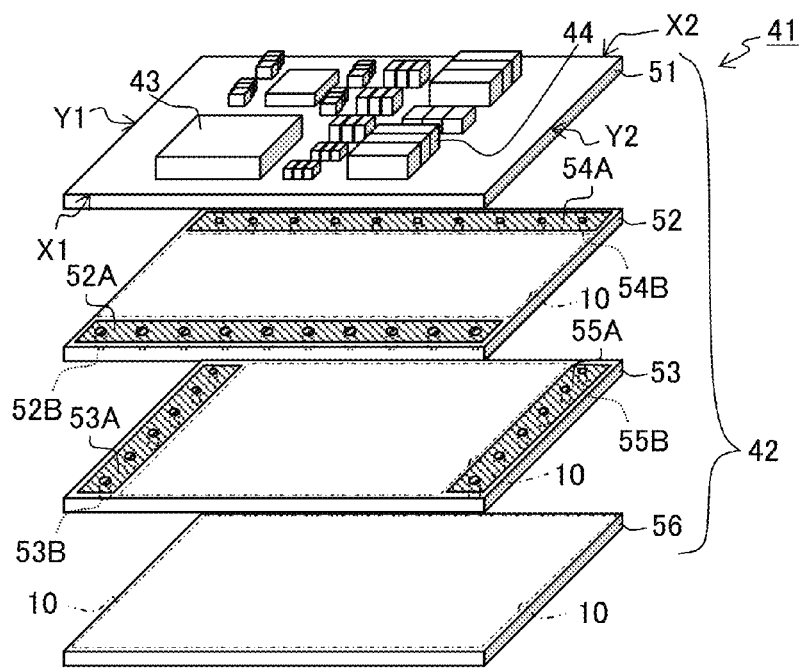
FIG. 4A is an exploded perspective view of a high-frequency module according to a second preferred embodiment of the present invention.
Figure 4B:
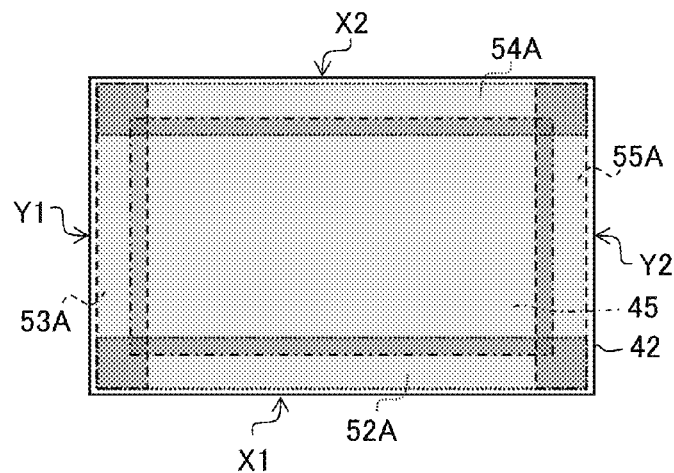
FIG. 4B is a transparent view thereof.

FIG. 4A is an exploded perspective view of a high-frequency module 41 according to the second preferred embodiment. FIG. 4B is a transparent view of the high-frequency module 41 as viewed from a top surface side in a lamination direction.

The high-frequency module 41 includes a laminate 42. The laminate 42 preferably includes four layers of base materials 51, 52, 53, 56, for example. The base material 51 configures a top surface of the laminate 42, and an RF-IC 43 and a plurality of passive elements 44 are mounted on a top surface of the base material 51. The base material 56 configures a bottom surface of the laminate 42, and a bottom surface electrode 45 that provides grounding is provided on a bottom surface of the base material 56.

The base materials 51, 52, 53, 56 are laminated in order according to the described order from the top surface side to the bottom surface side of the laminate 42.

Top surface electrodes are provided on the top surface of the base material 51, and via electrodes connected to the top surface electrodes are provided inside the base material.

Internal electrodes that provide grounding 52A, 54A and vias that provide grounding 52B, 54B are provided at portions in the vicinity of an outer edge of the base material 52. The internal electrode that provides grounding 52A extends along a side X1 as viewed from the top surface side in the lamination direction and preferably has a shape of a line including ends which are terminated in the vicinity of sides Y1 and Y2, respectively. The internal electrode that provides grounding 54A extends along a side X2 as viewed from the top surface side in the lamination direction and preferably has a shape of a line including ends which are terminated in the vicinity of the sides Y1 and Y2, respectively. Moreover, the vias that provide grounding 52B are arrayed along the side X1 at equal or substantially equal intervals and connected to the internal electrode that provides grounding 52A by overlapping therewith. The vias that provide grounding 54B are arrayed along the side X2 at equal or substantially equal intervals and connected to the internal electrode that provides grounding 54A by overlapping therewith.

Moreover, a region of the base material 52 where the internal electrodes that provide grounding 52A, 54A are not provided as viewed in the lamination direction is configured as a wiring region 10. In the wiring region 10 of the base material 52, an internal electrode and via electrodes configuring connection wiring of a high-frequency circuit are provided.

Internal electrodes that provide grounding 53A, 55A and vias that provide grounding 53B, 55B are provided at portions in the vicinity of an outer edge of the base material 53. The internal electrode that provides grounding 53A extends along the side Y1 as viewed from the top surface side in the lamination direction and preferably has a shape of a line including ends which are terminated in the vicinity of the sides X1 and X2, respectively. The internal electrode that provides grounding 55A extends along the side Y2 as viewed from the top surface side in the lamination direction and preferably has a shape of a line including ends which are terminated in the vicinity of the sides X1 and X2, respectively. The vias that provide grounding 53B are arrayed along the side Y1 at equal or substantially equal intervals and connected to the internal electrode that provides grounding 53A by overlapping therewith. The vias that provide grounding 55B are arrayed along the side Y2 at equal or substantially equal intervals and connected to the internal electrode that provides grounding 55A by overlapping therewith.

Moreover, a region of the base material 53 where the internal electrodes that provide grounding 53A, 55A are not provided as viewed in the lamination direction is configured as a wiring region 10. In the wiring region 10 of the base material 53, an internal electrode and via electrodes configuring the connection wiring of the high-frequency circuit are provided. It is to be noted that in the wiring region 10 of the base material 53, an internal electrode and via electrodes connected to the above-described vias that provide grounding 52B, 54B may be provided.

An entire region of the base material 56 as viewed in the lamination direction is configured as a wiring region 10. In the wiring region 10 of the base material 56, an internal electrode and via electrodes configuring the connection wiring of the high-frequency circuit are formed. Moreover, in the wiring region 10 of the base material 56, an internal electrode and via electrodes connected to the above-described vias that provide grounding 52B, 53B, 54B, 55B are provided. These internal electrode and via electrodes are also connected to the bottom surface electrode 45 that provides grounding.

Since the internal electrodes that provide grounding 52A to 55A are arranged in the laminate 42 in this way, when viewed from the top surface side in the lamination direction as illustrated in FIG. 4B, the internal electrodes that provide grounding 52A to 55A are endlessly continuous inside the laminate 42.

The high-frequency module 41 having such a configuration also obtains effects similar to those in the first preferred embodiment.

Next, a high-frequency module according to a third preferred embodiment of the present invention will be described.

Figure 5A:
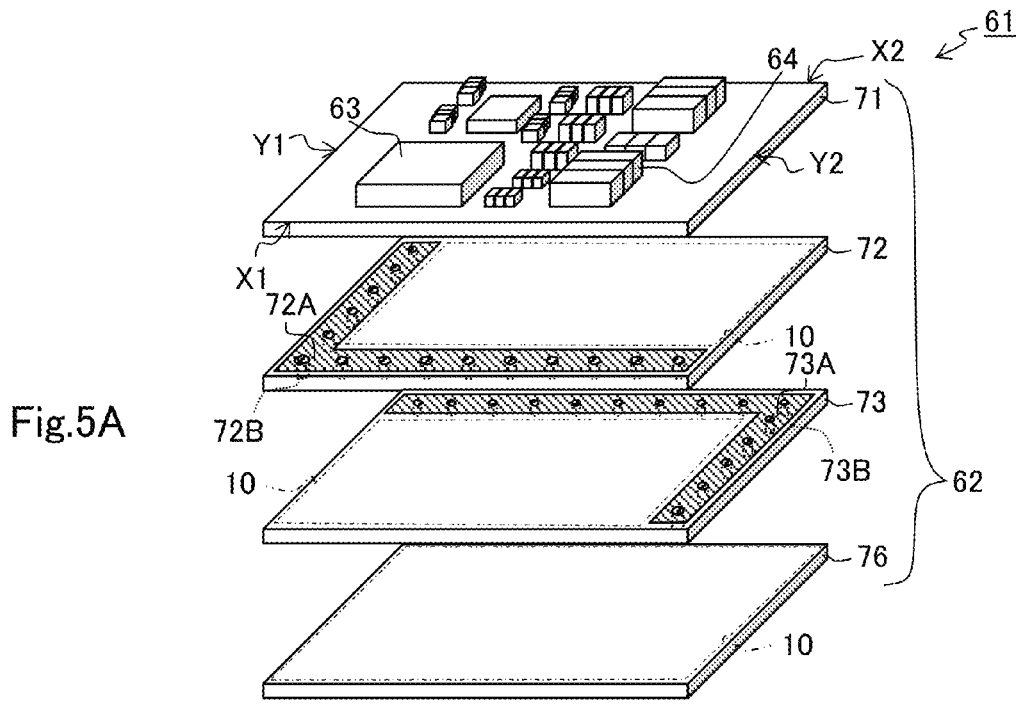
FIG. 5A is an exploded perspective view of a high-frequency module according to a third preferred embodiment of the present invention.
Figure 5B:
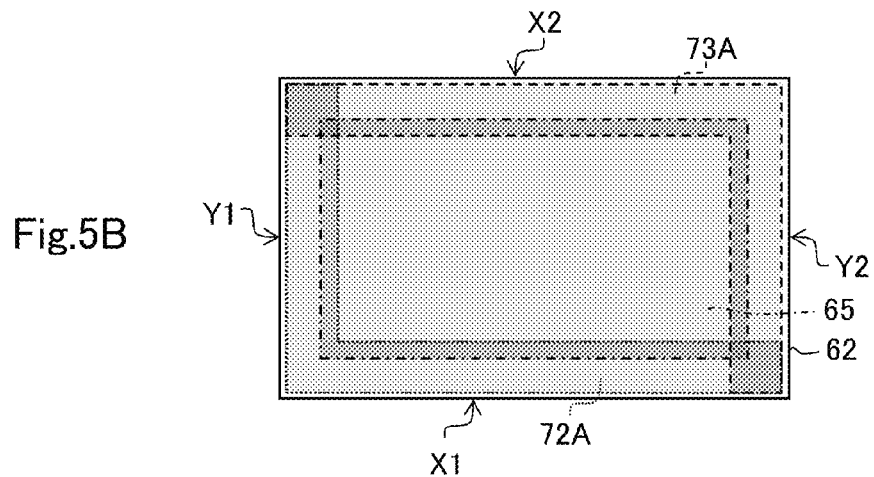
FIG. 5B is a transparent view thereof.
Figure 6:
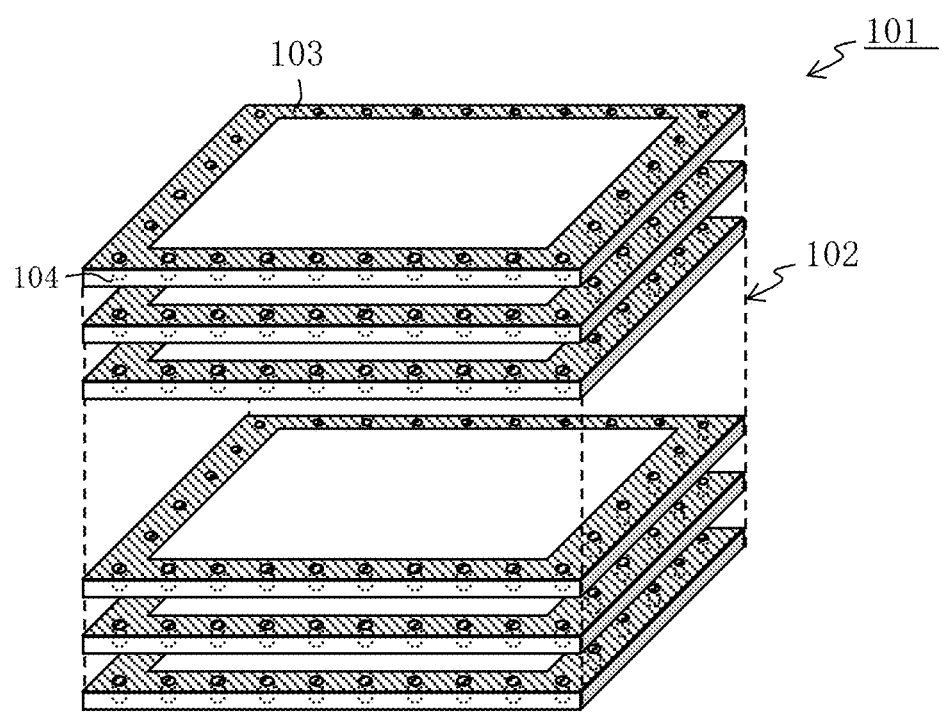
FIG. 6 is an exploded perspective view illustrating a laminate substrate of a high-frequency module according to a related art example.

FIG. 5A is an exploded perspective view of a high-frequency module 61 according to the third preferred embodiment. FIG. 5B is a transparent view of the high-frequency module 61 as viewed from a top surface side in a lamination direction.

The high-frequency module 61 includes a laminate 62. The laminate 62 preferably includes four layers of base materials 71, 72, 73, 76, for example. The base material 71 configures a top surface of the laminate 62, and an RF-IC 63 and a plurality of passive elements 64 are mounted on a top surface of the base material 71. The base material 76 configures a bottom surface of the laminate 62, and a bottom surface electrode 65 that provides grounding is provided on a bottom surface of the base material 76.

The base materials 71, 72, 73, 76 are laminated in order according to the described order from the top surface side to the bottom surface side of the laminate 62.

Top surface electrodes are provided on the top surface of the base material 71, and via electrodes connected to the top surface electrodes are provided inside the base material.

An internal electrode that provides grounding 72A and vias that provide grounding 72B are provided at a portion in the vicinity of an outer edge of the base material 72. The internal electrode that provides grounding 72A extends along sides X1 and Y1 as viewed from the top surface side in the lamination direction and preferably has a shape of a line including ends which are terminated in the vicinity of sides X2 and Y2, respectively. The vias that provide grounding 72B are arrayed along the sides X1 and Y1 at equal or substantially equal intervals and connected to the internal electrode that provides grounding 72A by overlapping therewith.

Moreover, a region of the base material 72 where the internal electrode that provides grounding 72A is not provided as viewed in the lamination direction is configured as a wiring region 10. In the wiring region 10 of the base material 72, an internal electrode and via electrodes configuring connection wiring of a high-frequency circuit are provided.

An internal electrode that provides grounding 73A and vias that provide grounding 73B are provided at a portion in the vicinity of an outer edge of the base material 73. The internal electrode that provides grounding 73A extends along the sides X2 and Y2 as viewed from the top surface side in the lamination direction and preferably has a shape of a line including ends which are terminated in the vicinity of the sides X1 and Y1, respectively. The vias that provide grounding 73B are arrayed along the sides X2 and Y2 at equal or substantially equal intervals and connected to the internal electrode that provides grounding 73A by overlapping therewith.

Moreover, a region of the base material 73 where the internal electrode that provides grounding 73A is not provided as viewed in the lamination direction is configured as a wiring region 10. In the wiring region 10 of the base material 73, an internal electrode and via electrodes configuring the connection wiring of the high-frequency circuit are provided. It is to be noted that in the wiring region 10 of the base material 73, an internal electrode and via electrodes connected to the above-described vias that provide grounding 72B may be provided.

An entire region of the base material 76 as viewed in the lamination direction is configured as a wiring region 10. In the wiring region 10 of the base material 76, an internal electrode and via electrodes configuring the connection wiring of the high-frequency circuit are provided. Moreover, in the wiring region 10 of the base material 76, an internal electrode and via electrodes connected to the above-described vias that provide grounding 72B, 73B are provided. These internal electrode and via electrodes are also connected to the bottom surface electrode 65 that provides.

Since the internal electrodes that provide grounding 72A, 73A are arranged in the laminate 62 in this way, when viewed from the top surface side in the lamination direction as illustrated in FIG. 5B, the internal electrodes that provide grounding 72A and 73A are endlessly continuous inside the laminate 62.

The high-frequency module 61 having such a configuration also obtains effects similar to those in the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a laminate including a plurality of base materials, the plurality of base materials being stacked on each other in a lamination direction;
   a plurality of bottom surface electrodes configured to provide grounding provided on one principal surface of the laminate in the lamination direction;
   a high-frequency circuit electrically connected to at least any of the bottom surface electrodes, a portion of the high-frequency circuit being provided inside the laminate; and
   a plurality of internal electrodes configured to provide grounding, each of the plurality of internal electrodes being provided on a respective one of the plurality of base materials of the laminate; wherein
   the plurality of internal electrodes are electrically connected to respective ones of the plurality of bottom surface electrodes;
   each of the plurality of internal electrodes has a line shape including ends and extends outside of the high-frequency circuit along an outer periphery of the laminate;
   each of the plurality of internal electrodes extends along less than an entirety of the outer periphery of the laminate when seen in the lamination direction such that a portion of each of the respective ones of the plurality of base materials is in direct contact with a portion of another one of the plurality of base materials along the outer periphery of the laminate; and
   the plurality of internal electrodes in combination extend along the entirety of the outer periphery of the laminate when seen in the lamination direction.

2. The high-frequency module according to claim 1, wherein
   the high-frequency circuit includes a surface mount element mounted on another principal surface opposite to the one principal surface of the laminate; and
   the bottom surface electrodes overlap with the high-frequency circuit when seen in the lamination direction.

3. The high-frequency module according to claim 1, wherein end portions of the respective plurality of internal electrodes overlap with each other at corner portions of the laminate when seen in the lamination direction.

4. The high-frequency module according to claim 1, wherein
   the laminate is a cube including first, second, third and fourth base materials; and
   the plurality of internal electrodes includes:
      a first internal electrode provided on the first base material along a first side of the laminate when seen in the lamination direction;
      a second internal electrode provided on the second base material along a second side perpendicular or substantially perpendicular to the first side;
      a third internal electrode provided on the third base material along a third side perpendicular or substantially perpendicular to the second side; and
      a fourth internal electrode provided on the fourth base material along a fourth side perpendicular or substantially perpendicular to the third side.

5. The high-frequency module according to claim 4, wherein the first base material, the second base material, the third base material, and the fourth base material are arrayed in the lamination direction in order according to the described order.

6. The high-frequency module according to claim 1, wherein
   the laminate is a cube including first and second base materials; and
   the plurality of internal electrodes includes:
      a first internal electrode provided on the first base material along a first side of the laminate when seen in the lamination direction;
      a second internal electrode provided on the second base material along a second side perpendicular or substantially perpendicular to the first side;
      a third internal electrode provided on the first base material along a third side perpendicular or substantially perpendicular to the second side; and
      a fourth internal electrode provided on the second base material along a fourth side perpendicular or substantially perpendicular to the third side.

7. The high-frequency module according to claim 1, wherein
   the laminate is a cube including first and second base materials; and
   the plurality of internal electrodes includes:
      a first internal electrode provided on the first base material along a first side of the laminate when seen in the lamination direction and a second side perpendicular or substantially perpendicular to the first side; and
      a second internal electrode provided on the second base material along a third side perpendicular or substantially perpendicular to the second side and a fourth side perpendicular or substantially perpendicular to the third side.

8. The high-frequency module according to claim 1, wherein the high-frequency circuit is a reader-writer circuit of a near field communication system.

9. The high-frequency module according to claim 1, wherein the high-frequency circuit is configured to be connected to antenna of a near field communication system.

10. The high-frequency module according to claim 1, wherein the high-frequency circuit includes an RF-IC, a low pass filter circuit and a matching circuit.

11. The high-frequency module according to claim 1, further comprising a plurality of bottom surface electrodes that provide input/output provided on the one principal surface of the laminate.

12. The high-frequency module according to claim 1, further comprising a first resist and a second resist provided on the laminate.

13. The high-frequency module according to claim 1, wherein the high-frequency circuit is a chip element.

14. The high-frequency module according to claim 1, wherein the laminate includes via electrodes configured to provide grounding.

15. The high-frequency module according to claim 1, wherein the laminate includes a wiring region at a location where none of the plurality of internal electrodes that provide grounding is located.

16. The high-frequency module according to claim 15, wherein an internal electrode and a via electrode configured to provide connection wiring are located in the wiring region.

17. The high-frequency module according to claim 14, wherein the plurality of internal electrodes configured to provide ground and the via electrodes configured to provide grounding are located at outer edges of the base materials.

* * * * *